(12) United States Patent
Ishihara

(10) Patent No.: US 9,756,735 B2
(45) Date of Patent: Sep. 5, 2017

(54) METHOD FOR MANUFACTURING PRINTED WIRING BOARD

(71) Applicant: IBIDEN CO., LTD., Ogaki-shi (JP)

(72) Inventor: Teruyuki Ishihara, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 11 days.

(21) Appl. No.: 14/886,544

(22) Filed: Oct. 19, 2015

(65) Prior Publication Data

US 2016/0113120 A1   Apr. 21, 2016

(30) Foreign Application Priority Data

Oct. 17, 2014 (JP) ................................. 2014-212614
Sep. 2, 2015 (JP) ................................. 2015-172608

(51) Int. Cl.
 H05K 3/02 (2006.01)
 H05K 3/10 (2006.01)
 H05K 3/00 (2006.01)
 H05K 3/42 (2006.01)
 H05K 3/46 (2006.01)

(52) U.S. Cl.
 CPC ........... *H05K 3/0097* (2013.01); *H05K 3/421* (2013.01); *H05K 3/4682* (2013.01); *H05K 3/4644* (2013.01); *H05K 2203/1536* (2013.01); *Y10T 29/49155* (2015.01)

(58) Field of Classification Search
 CPC H05K 3/4652; H05K 1/115; Y10T 29/49155; Y10T 29/49124; Y10T 29/49165; Y10T 29/49126

USPC ............................ 29/846, 825, 829, 830, 852
See application file for complete search history.

(56) References Cited

U.S. PATENT DOCUMENTS

| 6,376,052 B1 * | 4/2002 | Asai ..................... H05K 3/0094 |
| | | 174/255 |
| 7,767,495 B2 * | 8/2010 | Fuergut ................. H01L 21/561 |
| | | 438/110 |
| 2011/0240351 A1 | 10/2011 | Wakita et al. |

FOREIGN PATENT DOCUMENTS

WO   WO 2011/122246 A1   10/2011

* cited by examiner

*Primary Examiner* — Thiem Phan
(74) *Attorney, Agent, or Firm* — Oblon, McClelland, Maier & Neustadt, L.L.P.

(57) ABSTRACT

A method for manufacturing a printed wiring board includes forming on carrier a laminate including a second metal foil, a resin layer laminated on the second foil and a first metal foil laminated on the resin layer, irradiating laser upon the first foil such that opening is formed through the first foil and resin layer and exposes surface of the second foil at bottom, plating the first foil such that a via conductor is formed in the opening and a first conductor layer including the first foil and an electroplating film is formed on surface of the resin layer, removing the carrier from the laminate, patterning the first conductor layer on the resin layer, and patterning the second foil such that a second conductor layer including the second foil is formed on opposite surface of the resin layer. The second foil has thickness greater than thickness of the first foil.

18 Claims, 9 Drawing Sheets

METHOD FOR MANUFACTURING PRINTED WIRING BOARD

CROSS-REFERENCE TO RELATED APPLICATIONS

The present application is based upon and claims the benefit of priority to Japanese Patent Applications No. 2014-212614, filed Oct. 17, 2014 and No. 2015-172608, filed Sep. 2, 2015. The entire contents of these applications are incorporated herein by reference.

BACKGROUND OF THE INVENTION

Field of the Invention

The present invention relates to a printed wiring board that can be used as a core substrate on which a build-up layer can be formed and that has an insulating layer, a copper foil and a via conductor, and relates to a method for manufacturing the printed wiring board. More specifically, the present invention relates to a highly reliable printed wiring board that allows connection between a via conductor in a core substrate and a metal foil to be reliably performed, and relates to a method for manufacturing the printed wiring board.

Description of Background Art

International Publication No. 2011/122246 describes as a core substrate on which a build-up layer is formed. The entire contents of this publication are incorporated herein by reference.

SUMMARY OF THE INVENTION

According to one aspect of the present invention, a method for manufacturing a printed wiring board includes forming on a carrier a laminate structure including a second metal foil, a resin insulating layer laminated on the second metal foil and a first metal foil laminated on the resin insulating layer, irradiating laser upon the first metal foil such that an opening is formed through the first metal foil and the resin insulating layer and exposes a surface of the second metal foil at a bottom of the opening, plating the first metal foil such that a via conductor is formed in the opening and a first conductor layer including the first metal foil and an electroplating film on the first metal foil is formed on a first surface of the resin insulating layer, removing the carrier from the laminate structure, patterning the first conductor layer formed on the resin insulating layer, and patterning the second metal foil such that a second conductor layer including the second metal foil is formed on a second surface of the resin insulating layer. The second metal foil has a thickness which is greater than a thickness of the first metal foil.

According to another aspect of the present invention, a printed wiring board includes a resin insulating layer, a first conductor layer formed on a first surface of the resin insulating layer and including a first metal foil and an electroplating film formed on the first metal foil, a second conductor layer formed on a second surface of the resin insulating layer and including a second metal foil, and a via conductor formed in the resin insulating layer such that the via conductor is connecting the first conductor layer and the second metal foil of the second conductor layer through the resin insulating layer. The second metal foil of the second conductor layer has a thickness which is greater than a thickness of the first metal foil of the first conductor layer, and the first conductor layer has a thickness which is substantially equal to a thickness of the second conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
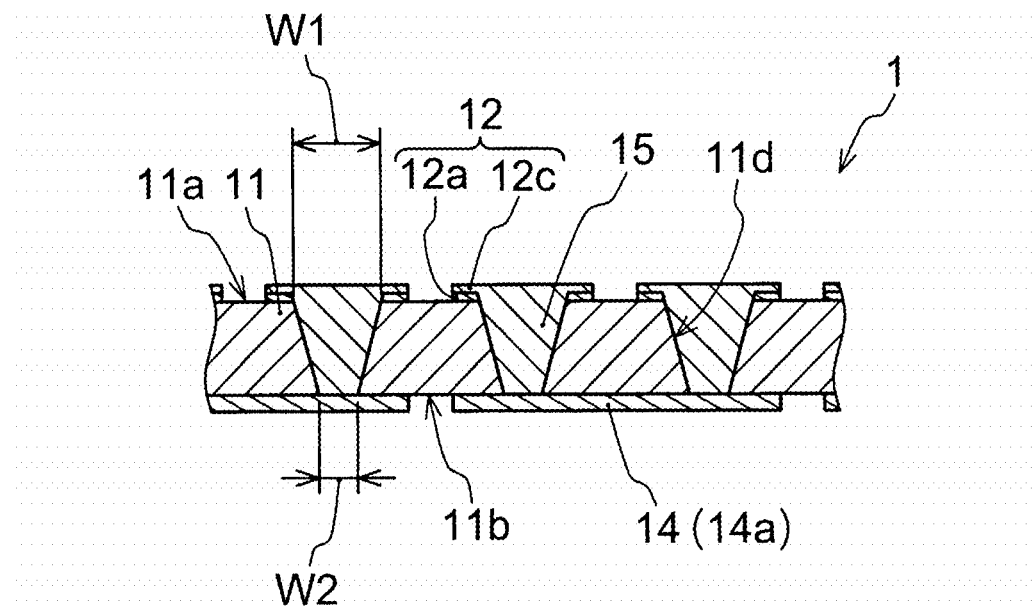
FIG. 1 is an explanatory cross-sectional view of a printed wiring board according to an embodiment of the present invention.

The embodiments will now be described with reference to the accompanying drawings, wherein like reference numerals designate corresponding or identical elements throughout the various drawings.

A printed wiring board according to an embodiment of the present invention is described with reference to the drawings. FIG. 1 is an explanatory cross-sectional view of a printed wiring board 1 of the present embodiment. In the printed wiring board 1 of the present embodiment, a first conductor layer 12 that includes a first metal foil (12a) and a first electroplating film (12c) is formed on a first surface (11a) of a resin insulating layer 11 that has the first surface (11a) and a second surface (11b). A second conductor layer 14 that includes a second metal foil (14a) is formed on a second surface (11b) of the resin insulating layer 11. Further, a via conductor 15 that connects the first conductor layer 12 and the second conductor layer 14 is formed in the resin insulating layer 11. The first conductor layer 12 that includes the first metal foil (12a) and the first electroplating film (12c) and the second conductor layer 14 that includes the second metal foil (14a) have substantially the same width. The second metal foil (14a) (second conductor layer 14) is thicker than the first metal foil (12a). Further, the via conductor 15 is formed to have a cross-sectional shape in which a width (W1) on the first conductor layer 12 side is larger than a width (W2) on the second conductor layer 14 side. The via conductor 15 is formed in an opening (11d) (see FIG. 2C) that penetrates the resin insulating layer 11 without penetrating through the second metal foil (14a) and uses the second metal foil (14a) as a bottom surface.

That is, in the present embodiment, the second conductor layer 14 includes only the second metal foil (14a), and is formed thicker than the first metal foil (12a). The first conductor layer 12 includes the first metal foil (12a), a metal coating (12b) (see FIG. 2D) such as a chemical plating that is not illustrated in FIG. 1, and the first electroplating film (12c). A metal foil having a thickness about the same as that of the first conductor layer 12 is used as the second metal foil (14a). Further, the second conductor layer 14 (second metal foil (14a)) is formed thick. Therefore, even when intensity of laser irradiation is strong, the second conductor layer 14 is not penetrated, and the second metal foil (14a) can be completely exposed without having a portion or residue of the resin insulating layer 11 remaining at a bottom of the opening (11d). On the other hand, laser is irradiated from the first metal foil (12a) side. Therefore, the width (W1) of the cross section of the opening (11d) on the first conductor layer 12 side is larger than the width (W2) of the cross section of the opening (11d) on the second conductor layer 14 side.

The reason that the second metal foil 14 is formed thicker than the first metal foil 12 is described as follows with reference to FIG. 5A. By respectively pasting metal foils (120, 121) on two sides of a resin insulating layer 110, a double-sided copper-clad resin insulating layer is formed. In order to improve adhesion between the resin insulating layer 110 and the metal foils (120, 121), bonding surfaces of the metal foils (120, 121) with the resin insulating layer 110 are roughened. That is, a surface of each of the metal foils (120, 121) on the resin insulating layer 110 side is formed as a mat surface 130 (exaggeratedly illustrated in the drawings). Therefore, a thickness of each of the metal foils (120, 121) partially becomes thin at a valley bottom part of the mat surface 130. Further, it is easy for the mat surface to absorb laser. Therefore, when the intensity of laser is too strong, it is likely that metal foil 121 is broken and a through hole is formed. Therefore, on a side close to the metal foil (14a) on the bottom surface side, the intensity of the laser is reduced.

Figure 5A:
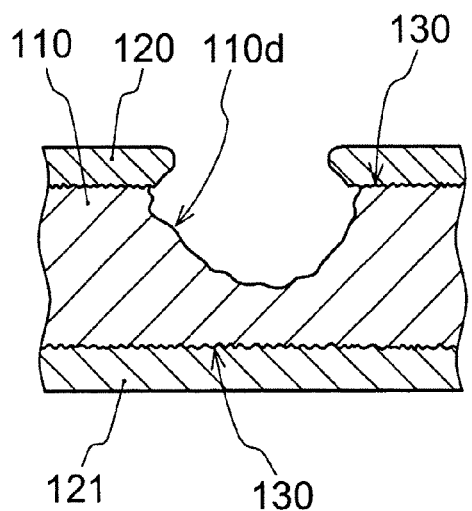
FIG. 5A is an explanatory diagram of when an opening is formed using laser in a resin insulating layer sandwiched by metal foils.
Figure 5B:
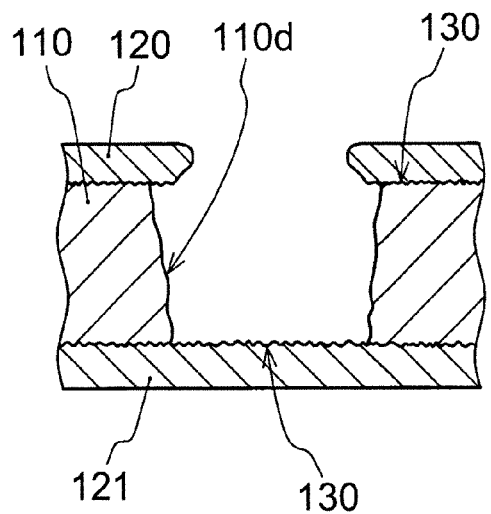
FIG. 5B is an explanatory diagram of when an opening is formed using laser in a resin insulating layer sandwiched by metal foils.

That is, when an opening (110d) is formed using laser, first, as illustrated in FIG. 5A, in order to penetrate the metal foil 120, laser irradiation using laser with strong power is performed. Thereafter, in order not to penetrate the metal foil 121, laser irradiation is performed one or more times using laser with weak power (see FIG. 5B). Thereby, drilling using laser irradiation is performed. Therefore, there is a tendency that a slight portion of the resin insulating layer 110 is likely to remain on a bottom surface of the opening (110d). Therefore, thereafter, a clean condition is achieved by increasing the number of times that a desmear treatment is repeated. However, it can also occur that the metal foil 121 is not reliably exposed at the bottom surface of the opening (110d). When even a light portion or residue of the resin insulating layer 110 remains inside the opening (110d) and the metal foil 121 is not completely exposed, the connection between the via conductor 150 embedded in the opening (110d) and the metal foil 121 becomes insufficient. Thereafter, due to heat cycles or a thermal stress, a crack (C) is likely to enter between the second metal foil 121 and the via conductor 150.

Figure 6A:
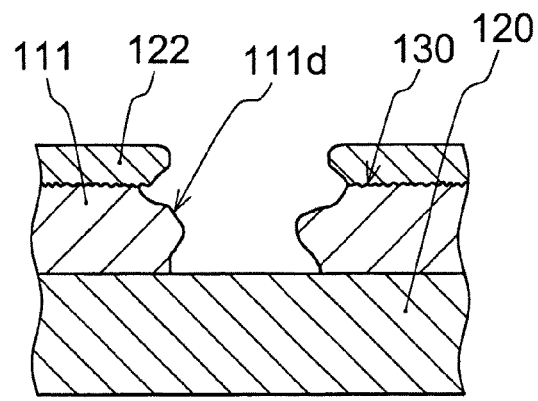
FIG. 6A is an explanatory diagram of when an opening is formed using laser in a multilayer body in which a relatively thick resin insulating layer is sandwiched by an electroplating film and a metal foil.
Figure 6B:
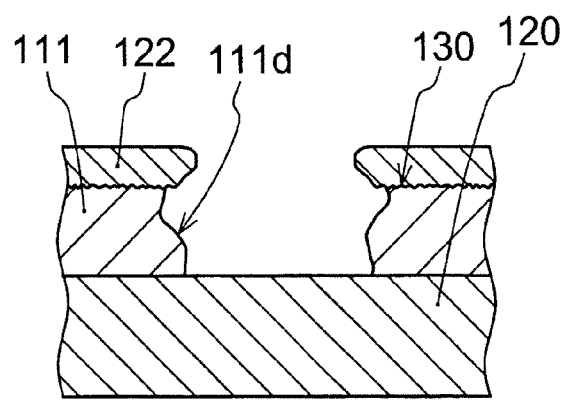
FIG. 6B is an explanatory diagram of when an opening is formed using laser in a multilayer body in which a relatively thick resin insulating layer is sandwiched by an electroplating film and a metal foil.
Figure 7A:
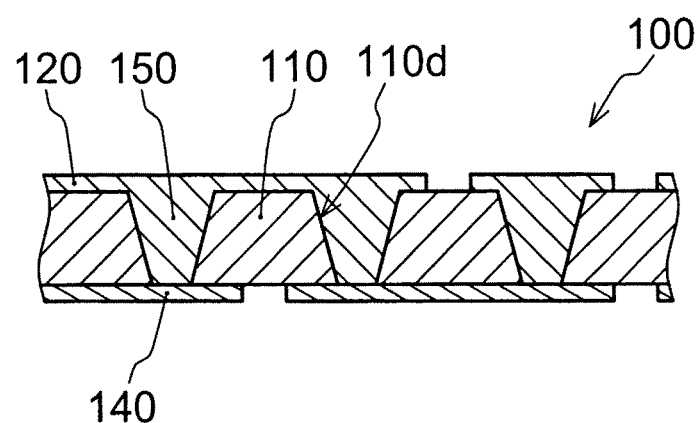
FIG. 7A is an explanatory diagram of a background printed wiring board as a core substrate.

On the other hand, there is also a case where, instead of a double-sided copper-clad resin insulating layer, the above-described conductor layer 120 that is obtained by forming an electroplating film on a surface of the printed wiring board illustrated in FIG. 7A is used as a base of a build-up layer. On the electroplating film, an interlayer resin insulating layer 111 and a metal foil 122 are laminated, and a build-up layer is formed. In this case, as illustrated in FIG. 6A, a bottom surface of an opening (111d) becomes a surface of the electroplating film of the conductor layer 120. Therefore, the surface is relatively smooth and is unlikely to absorb laser. Further, the conductor layer 120 is formed by the metal foil and the electroplating film and thus also has a thick thickness. Therefore, laser having a relatively high intensity can be irradiated. As a result, even for the relatively thick interlayer resin insulating layer 111, by irradiating strong laser for one or more times, as illustrated in FIG. 6A and 6B, the opening (111d) is formed. As a result, as illustrated in FIG. 6B, removal of glass fiber and ensuring a diameter of the bottom surface of the opening (111d) by laser irradiation can be reliably performed. As a result, in such an interlayer resin insulating layer 111, a problem such as that a crack enters between the via conductor and the lower-layer conductor layer 120 does not occur.

Figure 6C:
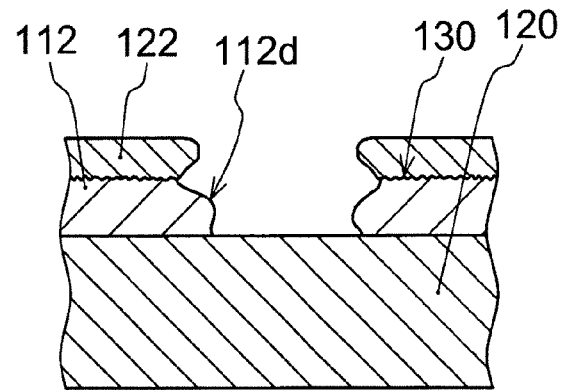
FIG. 6C is an explanatory diagram of when an opening is formed using laser in a multilayer body in which a relatively thin resin insulating layer is sandwiched by an electroplating film and a metal foil.

FIG. 6C illustrates an example of a case where an interlayer resin insulating layer 112 is relatively thin. In such a case where the interlayer resin insulating layer 112 is relatively thin, by irradiating laser of the same intensity as the laser of a strong intensity in the case of FIG. 6A but, for example, for a number of times less than the case of FIG. 6A, the second conductor layer 120 can be completely exposed in a sufficient shape at a bottom part of an opening (112d).

Therefore, in the case where an interlayer resin insulating layer and a metal foil are laminated in order to form a build-up layer, a problem of conduction such as that a crack enters a connection part between a via conductor and a lower-layer conductor layer does not occur. However, in a case of a printed wiring board for being used as a core substrate as in a case of a double-sided copper-clad resin insulating layer, connection between a via conductor and a conductor layer can become a problem. That is, the bottom surface of the opening that is formed by laser irradiation is the mat surface 130, and the metal foil itself is thin. Therefore, to avoid penetration by the laser, the intensity of the laser irradiated is reduced. As a result, a portion or residue of the resin insulating layer 110 is likely to remain at the bottom part of the opening (110d) (see FIG. 5B). Therefore, as described above, a crack (C) is likely to enter between the via conductor 150 and the second conductor layer 140 (see FIG. 7B) and electrical resistance is likely to increase.

Therefore, in the present embodiment, as illustrated in FIG. 1, to prevent such a problem from occurring, the second metal foil (14a) that is exposed at the bottom of the opening (11d) is formed thicker than the first metal foil (12a). As a result, irradiation of laser of such a high intensity that a portion of the second metal foil (14a) is removed can be performed. As a result, a portion or resin residue of the resin insulating layer 11 does remain on the surface exposed by the opening. That is, as described above, the thicknesses of the first metal foil (12a) and the second metal foil (14a) are varied.

On the other hand, the first conductor layer 12 and the second conductor layer 14 have substantially the same thickness. As a result, occurrence of warpage can be prevented. Therefore, when the via conductor 15 is filled in the opening (11d), the first electroplating film (12c) is formed also on the surface of the first metal foil (12a). Before the first electroplating film (12c) is formed, the metal coating (12b) (see FIG. 2D) for being used as a power feeding layer is formed on an exposed surface of the resin insulating layer 11 in the opening (11d), and the first conductor layer 12 is formed by the first metal foil (12a), the metal coating (12b) such as a chemical plating film, and the first electroplating film (12c). It is also possible that the metal coating (12b) is not formed by chemical plating but is formed using a method such as vacuum deposition or sputtering.

The resin insulating layer 11 is an insulating layer that has the first surface (11a) and the second surface (11b) that is on the opposite side of the first surface (11a). The resin insulating layer 11, for example, may be formed by impregnating a core material such as glass fiber with a resin composition that contains a filler, and may also be formed using a resin composition alone that contains a filler. Further, the resin insulating layer 11 may be formed to be a single layer and may also be formed from multiple insulating layers. When the resin insulating layer 11 is formed from multiple insulating layers, for example, a thermal expansion coefficient, flexibility and a thickness of the resin insulating layer 11 can be easily adjusted. Examples of the resin include epoxy and the like. The thickness of the resin insulating layer 11, for example, is in a range of 25-100 μm. The first conductor layer 12 is formed on the first surface (11a) of the resin insulating layer 11, and the second conductor layer 14 is formed on the second surface (11b). The first conductor layer 12 is a pattern formed on the first surface (11a) of the resin insulating layer 11. A method for forming the first conductor layer 12 is not particularly limited. Preferably, the first conductor layer 12 includes the first electroplating film (12c) that is formed together with the above-described first metal foil (12a) by electroplating. When the first conductor layer 12 is mainly an electroplating film, there is an advantage that the first conductor layer 12 is formed as a pure metal film. Copper is an example of a material of which the first conductor layer 12 is formed. Copper allows electroplating to be easily performed and has a small electrical resistance, and a corrosion problem is also unlikely to occur. The first conductor layer 12 has a thickness, for example, in a range of 10-20 μm.

In the example illustrated in the present embodiment, the first conductor layer 12 includes the first metal foil (12a), the metal coating (12b) (not illustrated in FIG. 1) that is formed by chemical plating or the like, and the first electroplating film (12c) that is formed by electroplating or the like. As will be described later in a manufacturing method, the metal coating (12b) is used as a power feeding layer for forming the via conductor 15 in the opening (11d) of the resin insulating layer 11, and is formed also on the first metal foil (12a) in order to perform chemical plating over the entire surface. An example of a material of the first metal foil (12a) is a copper foil. The reason that copper is used for the first electroplating film (12c) is because copper has a small electrical resistance and also because it is easy to perform electroplating on copper.

As will be clear in an example of the manufacturing method to be described later, the first conductor layer 12 is formed by the first metal foil (12a), the metal coating (12b) (see FIG. 2D) on the first metal foil (12a), and the first electroplating film (12c). The first electroplating film (12c) is formed such that the first conductor layer 12 has a total thickness about the same as that of the second conductor layer 14 to be described later. The first conductor layer 12 is patterned by etching at the same time as the second metal foil (14a).

The second conductor layer 14 is formed on the second surface (11b) of the resin insulating layer 11. A method for forming the second conductor layer 14 is not particularly limited. In the present embodiment, a copper foil is used. The second conductor layer 14 has a thickness, for example, in a range of 10-20 μm. The second conductor layer 14 is illustrated as an example of a single layer, the second metal foil (14a), in FIG. 1. However, for example, the second conductor layer 14 may also be formed by a metal foil and a plating film. However, the second metal foil (14a) is thicker than the first metal foil (12a). For example, the second metal foil (14a) is formed about twice as thick as the first metal foil (12a). When a normal double-sided copper-clad resin insulating layer is formed, metal foils having the same thickness are used on both sides. Therefore, as will be described later in the manufacturing method, the resin insulating layer is not sandwiched by two metal foils and bonded to the metal foils by thermal compression bonding. The second metal foil (14a) is pasted to the carrier 18 (see FIG. 2A). Thereafter, the resin insulating layer 11 and the first metal foil (12a) are laminated.

The via conductor 15 penetrates the resin insulating layer 11 and electrically connects the first conductor layer 12 and the second conductor layer 14. As will be described later in the manufacturing method, the via conductor 15 is formed by forming the opening (11d) with the second metal foil (14a) as a bottom surface and filling the opening (11d) with a conductor, the opening (11d) being formed by irradiating laser from above the first metal foil (12a) that is provided on the first surface (11a) of the resin insulating layer 11. As a material for the via conductor 15, for example, copper is used. In the present embodiment, copper is filled in the opening (11d) by electroplating. Therefore, the via conductor 15 is simultaneously formed by copper plating together with the first electroplating film (12c) of the first conductor layer 12.

In this way, the via conductor 15 is formed by filling a metal in the opening (11d) that is formed by irradiating laser to the resin insulating layer 11 from the first metal foil (12a) side. The opening (11d) is larger on the first metal foil (12a) side and smaller on the second metal foil (14a) side. Therefore, a cross-sectional structure of the via conductor 15 is characterized in that the width (W1) on the first conductor layer 12 side is larger than the width (W2) on the second conductor layer 14 side. That is, it means that the opening (11d) is formed from the side of the first metal foil (12a) having a thin thickness toward the side of the second metal foil (14a) having a thick thickness.

As described above, according to the present embodiment, among the metal foils provided on the two sides of the resin insulating layer 11, the first metal foil (12a) is formed thin and the second metal foil (14a) is formed thick. In addition, the laser irradiation for forming the opening (11d) is performed from the first metal foil (12a) side. Therefore, even when laser reaches the second metal foil (14a) after the resin insulating layer 11 is penetrated, the second metal foil (14a) is not penetrated. Therefore, even when strong laser is irradiated, it does not cause any problem, and a portion or residue of the resin insulating layer 11 does not remain at the bottom of the opening (11d). As a result, at the bottom of the opening (11d), only the second metal foil (14a) is exposed, and the via conductor 15 that is formed in the opening (11d) and the second metal foil (14a) are reliably in contact with each other. Even when a stress based on a difference in thermal expansion due to heat cycles thereafter is applied, a crack or a cleavage does not enter a connecting surface between the via conductor 15 and the second metal foil (14a). Therefore, a very highly reliable printed wiring board is obtained. By using this printed wiring board 1 as a core substrate and laminating a build-up layer on one side or both sides of the printed wiring board 1, a highly reliable multilayer printed wiring board is obtained. As described above, the surface of the conductor layer is an electroplating film. Therefore, a via conductor of the build-up layer and the conductor layer can be very reliably bonded, and a very highly reliable multilayer printed wiring board is obtained.

A method for manufacturing the printed wiring board illustrated in FIG. 1 is described with reference to FIG. 2A-2E.

Figure 2A:
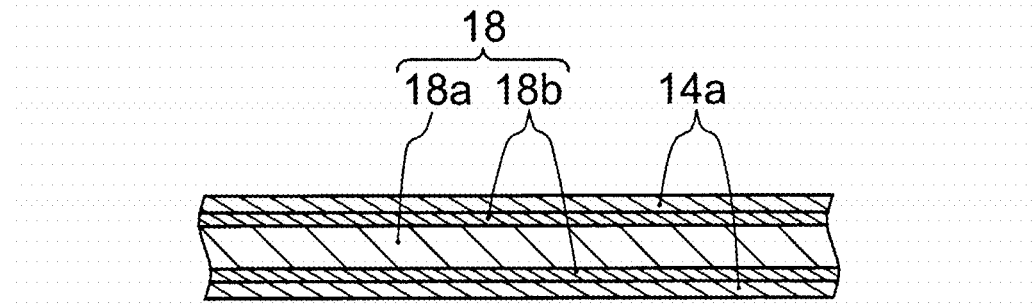
FIG. 2A illustrates a process for manufacturing the printed wiring board of FIG. 1.

First, as illustrated in FIG. 2A, a carrier 18 is prepared on which the second metal foil (14a) is provided. As the carrier 18, for example, a copper-clad laminated plate is used. However, the present invention is not limited to this. In the example illustrated in FIG. 2A, for example, to both sides of a support plate (18a) that is formed of a prepreg, for example, the second metal foil (14a) with a carrier copper foil (18b) is affixed using an adhesive or using a thermal compression bonding method or the like; for example, the carrier copper foil (18b) side is affixed to the both sides of the support plate (18a). Thereby, the carrier 18 is formed. For example, the second metal foil (14a) is formed to have a thickness of 10-20 μm, and the carrier copper foil (18b) is formed to have a thickness of 15-30 μm and preferably about 18 μm. A surface of the second metal foil (14a) that is bonded to the carrier copper foil (18b) is a smooth surface. However, a surface of the second metal foil (14a) that is exposed to the outside, although not illustrated in the drawings, is a roughened mat surfaced. As will be described later, the resin insulating layer 11 is bonded to the surface that is exposed to the outside. Therefore, to increase a bonding strength, it is preferable that the surface that is exposed to the outside be a rough surface. On the other hand, the surface that is bonded to the carrier copper foil (18b) is peeled off later and thus is preferably smooth.

The carrier 18 is used as a substrate during processing of the following processes and, as will be described later, will be removed without being left as a printed wiring board. Therefore, in order for the second metal foil (14a) to be easily separated from the carrier 18, the second metal foil (14a) is bonded to and fixed on the carrier 18 over the entire surface via an easily separable adhesive such as a thermoplastic resin. That is, the carrier copper foil (18b) and the second metal foil (14a) are bonded to each other over the entire surface by a thermoplastic resin or the like, and the second metal foil (14a) with the carrier copper foil (18b) is formed. The carrier copper foil (18b) is bonded to the support plate (18a) by thermal compression bonding or the like. By being bonded by the thermoplastic resin, even when being bonded over the entire surface, the second metal foil (14a) and the carrier copper foil (18b) can be easily separated from each other by increasing temperature. However, without being limited to this, for example, it is also possible that the second metal foil (14a) and the carrier copper foil (18b) are bonded or fixed to each other over only a surrounding area. By being fixed to each other over the surrounding area, the two can be easily separated from each other by cutting and removing the surrounding area. Therefore, the fixation in the surrounding area in this case is not limited to using the thermoplastic resin. It is desirable that there be no difference in thermal expansion coefficient or the like between the carrier 18 and the second metal foil (14a). Therefore, when nickel is used for the second metal foil (14a), it is preferable that the same material such as a carrier nickel foil be used instead of the carrier copper foil. A release layer may be suitably provided on the surface of the carrier 18 on which the second metal foil (14a) is provided.

In the example illustrated in FIG. 2A, the second metal foil (14a) with the carrier copper foil, which is obtained by bonding the carrier copper foil (18b) and the second metal foil (14a) in advance using an adhesive or the like, is affixed to the support plate (18a). However, it is also possible that the second metal foil (14a) is bonded over the entire surface or in the surrounding area or the like to the carrier 18 that is obtained by affixing the carrier copper foil (18b) or the like to the support plate (18a). Further, in the example illustrated here, the second metal foil (14a) is provided on each of both sides of the carrier 18. This is preferable in that two printed wiring boards are manufactured at once utilizing both sides of the carrier 18 that is to be discarded. However, it is also possible that only one side of the carrier 18 is used, or different circuit patterns are formed on the two sides. In an example described below, the same circuit pattern is formed on the both sides. Therefore, although both sides are illustrated in the drawings, only one side is described, and, with regard to the other side, reference numerals and description are partially omitted.

Figure 2B:
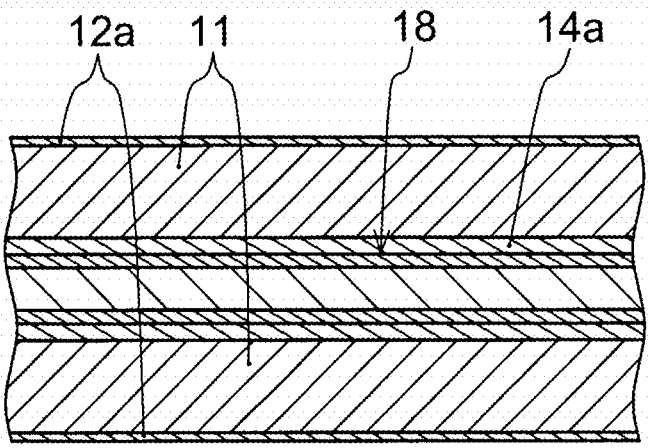
FIG. 2B illustrates a process for manufacturing the printed wiring board of FIG. 1.

As illustrated in FIG. 2B, the resin insulating layer 11 and the first metal foil (12a) that becomes a part of the first conductor layer 12 are laminated and are bonded. For the bonding of the resin insulating layer 11 and the first metal foil (12a), a method is used in which bonding is performed by applying pressure and heat. The first metal foil (12a) has a thickness about one half of the second metal foil (14a) and is about 5-10 μm, and a surface of the first metal foil (12a) on a side facing the resin insulating layer 11 is formed as a rough surface, which is not illustrated in the drawings.

Figure 2C:
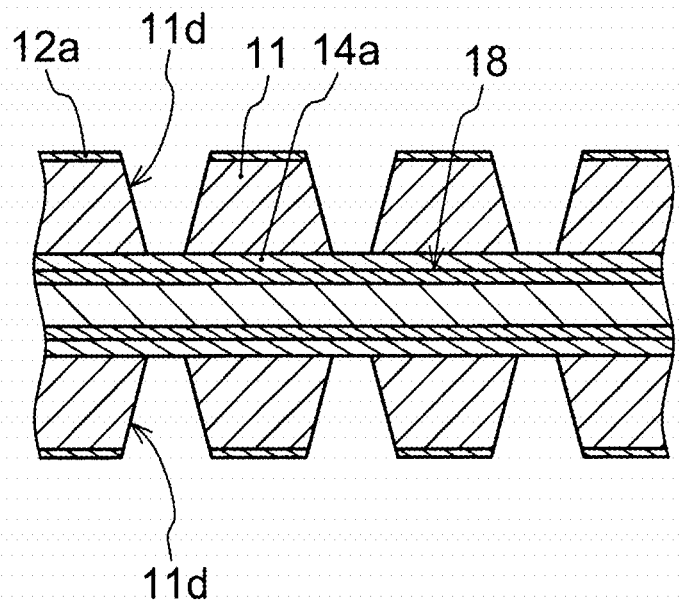
FIG. 2C illustrates a process for manufacturing the printed wiring board of FIG. 1.

As illustrated in FIG. 2C, the opening (11d) is formed. As a method for forming the opening (11d), a method of laser irradiation is used. That is, the opening (11d) is formed at a portion where the first conductor layer 12 and the second conductor layer 14 that are provided on the two sides of the first resin insulating layer 11 are connected, and is processed by irradiating $CO_2$ laser or the like from the surface of the first metal foil (12*a*). The second metal foil (14*a*) is formed thick and thus can be processed using strong laser irradiation without worrying about that the second metal foil (14*a*) may be penetrated. As a result, the opening (11*d*) is formed such that the surface of the second metal foil (14*a*) is completely exposed at the bottom of the opening (11*d*).

Figure 2D:
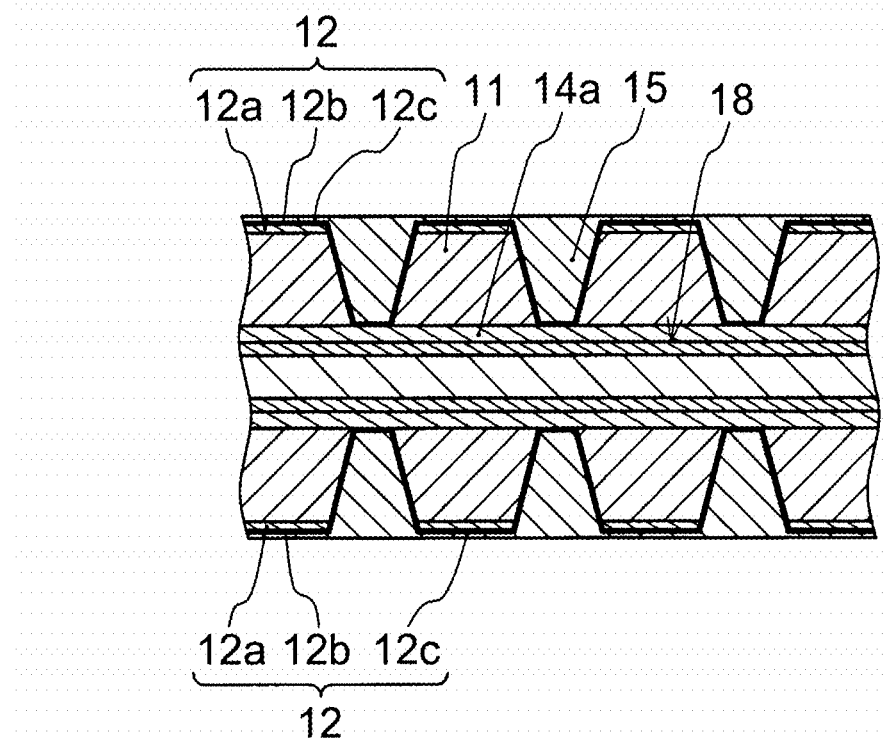
FIG. 2D illustrates a process for manufacturing the printed wiring board of FIG. 1.

As illustrated in FIG. 2D, the metal coating (12*b*) such as a chemical plating film is formed on the inner surface of the opening (11*d*) and on the first metal foil (12*a*). Next, for example, by electroplating, the via conductor 15 is formed and a layer of the first electroplating film (12*c*) is formed on the surface of the metal coating (12*b*). The first electroplating film (12*c*) is formed, for example, on the entire surface, and is simultaneously patterned together with the formation of the second conductor layer 14. However, it is also possible that pattern plating is performed by forming a resist layer, forming an opening only at a portion of a pattern of the first conductor layer 12, and performing electroplating only in the opening. In the present embodiment, the first conductor layer 12 includes the first metal foil (12*a*), the metal coating (12*b*) and the first electroplating film (12*c*). However, in the example illustrated in FIG. 2D, the first electroplating film (12*c*) is also formed on the entire surface, and is not yet patterned at this point.

In the above-described example, the first electroplating film (12*c*) is formed on the entire surface. However, as described later, when the second metal foil (14*a*) is patterned to form the second conductor layer 14, etching is performed. From the viewpoint of performing etching at the same time as the formation of the second conductor layer 14, the first electroplating film (12*c*) is formed on the entire surface. However, as described above, it is also possible that the first electroplating film (12*c*) is formed by pattern plating. That is, a resist mask is formed on the entire surface; only a portion of a pattern of the first conductor layer 12 is removed by photoetching; and only the portion is subjected to electroplating. It is possible that the first electroplating film (12*c*) is formed by removing the resist mask thereafter. In this case, when etching for forming the second conductor layer 14 is performed, the entire surface of the first conductor layer 12 is protected by the resist mask. Therefore, in a state of being fixed on the carrier 18, portions of the first metal foil (12*a*) and the metal coating (12*b*) on the first metal foil (12*a*), where the first electroplating film (12*c*) is not formed (portions that are covered by the resist mask for forming pattern plating of the first electroplating film (12*c*)) are removed. Or, it is also possible that the resist mask is removed after the second conductor layer 14 is formed. The first metal foil (12*a*) and the metal coating (12*b*) on the first metal foil (12*a*) are thin and thus are removed by etching the entire surface without using a mask.

Figure 2E:
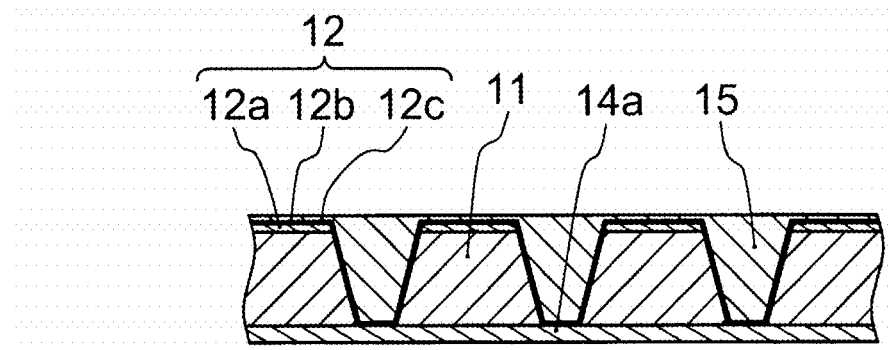
FIG. 2E illustrates a process for manufacturing the printed wiring board of FIG. 1.

As illustrated in FIG. 2E, the carrier 18 is removed. As described above, the carrier 18 (carrier copper foil (18*b*)) and the second metal foil (14*a*) are fixed to each other by an easily separable adhesive or the like such as a thermoplastic resin. Therefore, the removal of the carrier 18 can be easily performed by peeling one of the carrier 18 and the second metal foil (14*a*) from the other in a state in which the temperature has been raised. However, without being limited to this, for example, it is also possible that the second metal foil (14*a*) and the carrier copper foil (18*b*) are bonded or fixed to each other over only a surrounding area. Then, a surface of the second metal foil (14*a*) in contact with the carrier copper foil (18*b*) is exposed. By removing the carrier 18, two printed wiring boards that are formed on the two sides of the carrier 18 are obtained. In FIG. 2E, for clarity of the description, only the upper side of the carrier 18 illustrated in FIG. 2D is illustrated.

Then, by patterning the first metal foil (12*a*), the metal coating (12*b*), the first electroplating film (12*c*) and the second metal foil (14*a*), the first conductor layer 12 and the second conductor layer 14 are respectively formed, and the printed wiring board 1 illustrated in FIG. 1 is obtained. The patterning is performed as follows. A resist is applied to the entire surfaces on both sides. The resist remains only on portions of the patterns. Portions of the first electroplating film (12*c*) and the second metal foil (14*a*) other than the portions where the patterns are formed are exposed. The entire printed wiring board is immersed in an etching solution. Thereby, the portions of the first electroplating film (12*c*) and the like other than the portions where the patterns are formed are removed. Thereafter, by removing the resist mask, the two sides are simultaneously patterned, and the first conductor layer 12 and the second conductor layer 14 are simultaneously formed. This state is illustrated in FIG. 1.

In the case where the above-described first electroplating film (12*c*) of the first conductor layer 12 is subjected to pattern plating, during the patterning process, in a state in which the entire surface on the first conductor layer 12 side is covered by a resist coating, only the second metal foil (14*a*) side is patterned using the same method as described above. After etching, the resist patterns on both sides are removed. In the case where the above-described first conductor layer 12 is subjected to pattern plating, when the first metal foil (12*a*) and the metal coating (12*b*) on the first metal foil (12*a*) have not yet been patterned, after the resist films on the both sides are removed, by further immersing the entire surface in an etching solution, the first metal foil (12*a*) and the metal coating (12*b*) are also patterned. The first metal foil (12*a*) and the metal coating (12*b*) are thin. Therefore, even when the entire surface is exposed to the etching solution, it has no effect on other portions, and the first conductor layer 12 side is also completely patterned.

By being manufactured using such a method, after the second metal foil (14*a*) is pasted on the carrier 18, the resin insulating layer 11 and the first metal foil (12*a*) are laminated and are bonded by thermal compression bonding, and thus, even when the first metal foil (12*a*) and the second metal foil (14*a*) have different thicknesses, manufacturing can be performed without any problem. As a result, the metal foil (first metal foil (12*a*)) on the laser irradiation side can be formed thin and the metal foil (second metal foil (14*a*)) on the bottom surface side of the opening (11*d*) can be formed thick. Therefore, even when strong laser is irradiated, the second metal foil (14*a*) is not penetrated by the laser. As a result, the opening (11*d*) can be very easily formed, and it does not occur that a portion of the resin insulating layer 11 or residue of the resin insulating layer 11 remains at the bottom of the opening (11*d*). As a result, the problem such as that a crack enters a bonding interface between the via conductor 15 and the metal foil can be resolved.

An example in which an interlayer resin insulating layer and a conductor layer are further laminated and built up on each of both sides of the printed wiring board 1 is described with reference to FIG. 3A-3E.

Figure 3A:
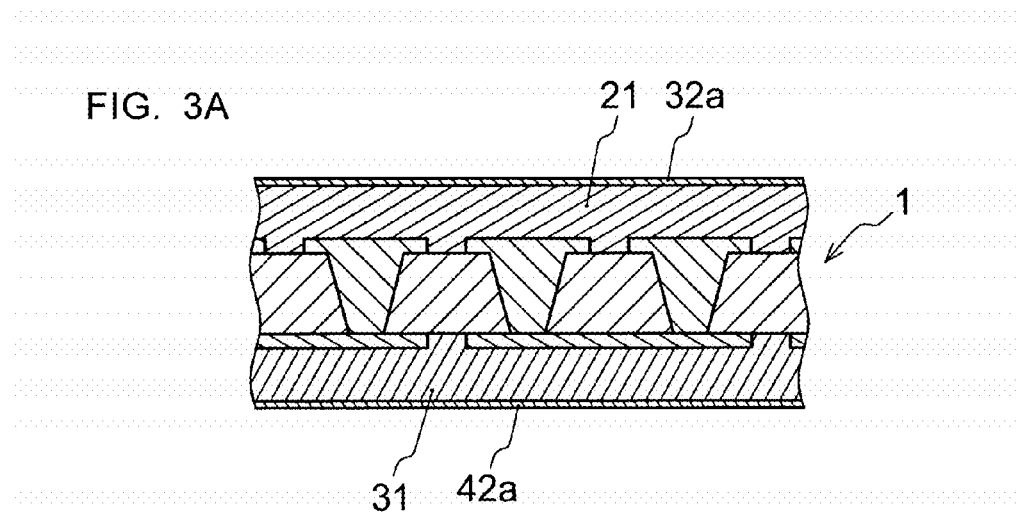
FIG. 3A illustrates a process for forming a build-up layer on each of both sides of a core substrate using the printed wiring board of FIG. 1 as the core substrate.

First, as illustrated in FIG. 3A, an interlayer resin insulating layer 21 and a third metal foil (32*a*), and an interlayer resin insulating layer 31 and a fourth metal foil (42*a*), are respectively laminated and heated and press-bonded to both sides of the printed wiring board 1. As a result, a multilayer body of these layers is formed. This process is performed in the same way as the above-described process illustrated in FIG. 2B. The third and fourth metal foils (32a, 42a) each have a thickness of about 5-10 μm, which is the same as the above-described first metal foil (12a), and each have a surface formed as a rough surface, the surface facing the interlayer resin insulating layer 21 or the interlayer resin insulating layer 31. Further, the interlayer resin insulating layers (21, 31) can be formed using the same material as the resin insulating layer 11. Further, it is also possible to use a prepreg obtained by impregnating a core material such as a glass fiber with a resin composition containing a filler, or to use a prepreg that does not contain a core material.

Figure 3B:
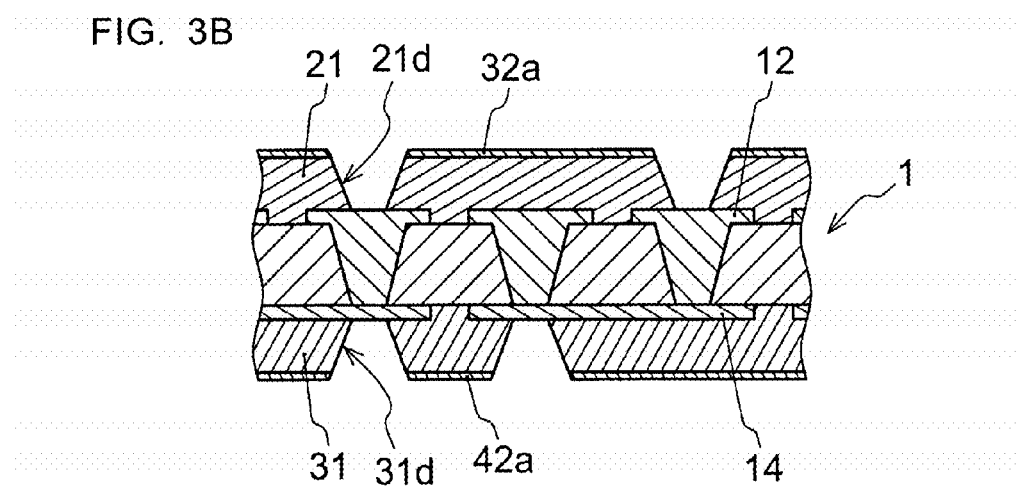
FIG. 3B illustrates a process for forming the build-up layer on each of both sides of the core substrate using the printed wiring board of FIG. 1 as the core substrate.

As illustrated in FIG. 3B, openings (21d, 31d) are respectively formed at places where via conductors of the interlayer resin insulating layers (21, 31) are formed. The openings (21d, 31d) are formed using a laser irradiation method as the above-described method illustrated FIG. 2C. That is, the openings (21d, 31d) are respectively formed at a portion where the first conductor layer 12 and a third conductor layer 32 that are respectively provided on both sides of the second resin insulating layer 21 are connected to each other and at a portion where the second conductor layer 14 and a fourth conductor layer 42 that are respectively provided on both sides of the and third resin insulating layer 31 are connected to each other. By respectively irradiating $CO_2$ laser from surfaces of the third metal foil (32a) and the fourth metal foil (42a), the interlayer resin insulating layers (21, 31) are processed.

Figure 3C:
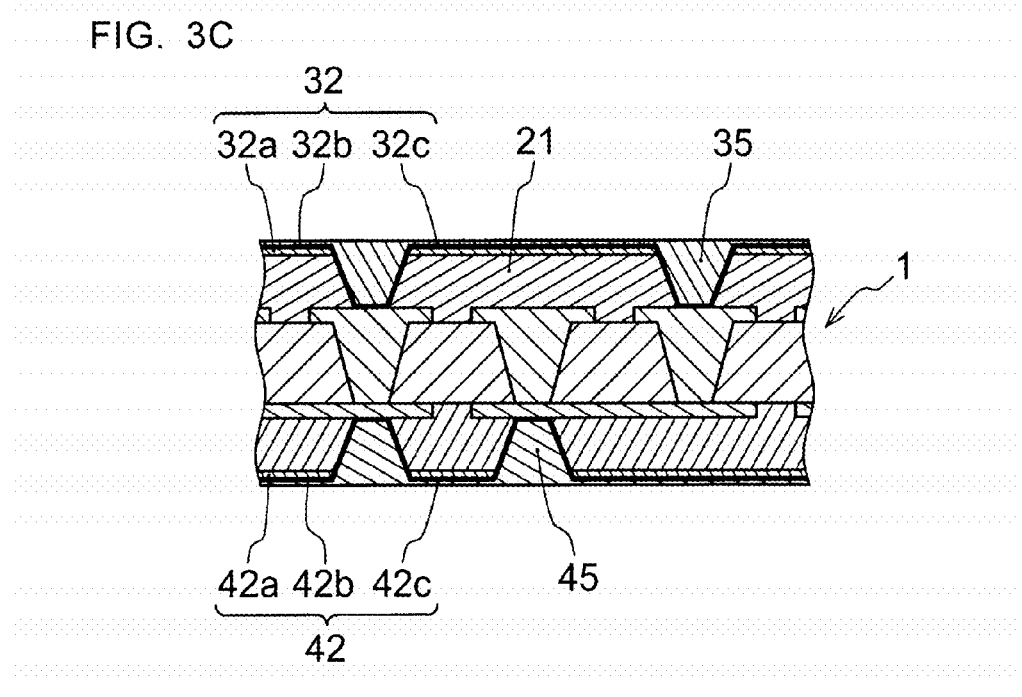
FIG. 3C illustrates a process for forming the build-up layer on each of both sides of the core substrate using the printed wiring board of FIG. 1 as the core substrate.

Thereafter, as illustrated in FIG. 3C, metal coatings (32b, 42b) and third and fourth electroplating films (32c, 42c) are respectively formed. That is, similar to FIG. 2D, in the opening (21d) and on the third metal foil (32a), and in the opening (31d) and on the fourth metal foil (42a), metal coatings (32b, 42b) such as chemical plating films are respectively formed. Next, for example, by electroplating, via conductors (35, 45) are respectively formed, and layers of the third and fourth electroplating films (32c, 42c) are respectively formed on surfaces of the metal coatings (32b, 42b). The formation of the third and fourth electroplating films (32c, 42c) is performed by electroplating using the metal coatings (32b, 42b) as power feeding layers. In this case, patterning may be performed after the entire surface is subjected to electroplating, or after a resist mask is formed in advance. In this case, by performing electroplating also in the openings (21d, 31d), the via conductors (35, 45) are formed. The third conductor layer 32 includes the third metal foil (32a), the metal coating (32b) and the third electroplating film (32c). Further, the fourth conductor layer 42 includes the fourth metal foil (42a), the metal coating (42b) and the fourth electroplating film (42c).

Figure 3D:
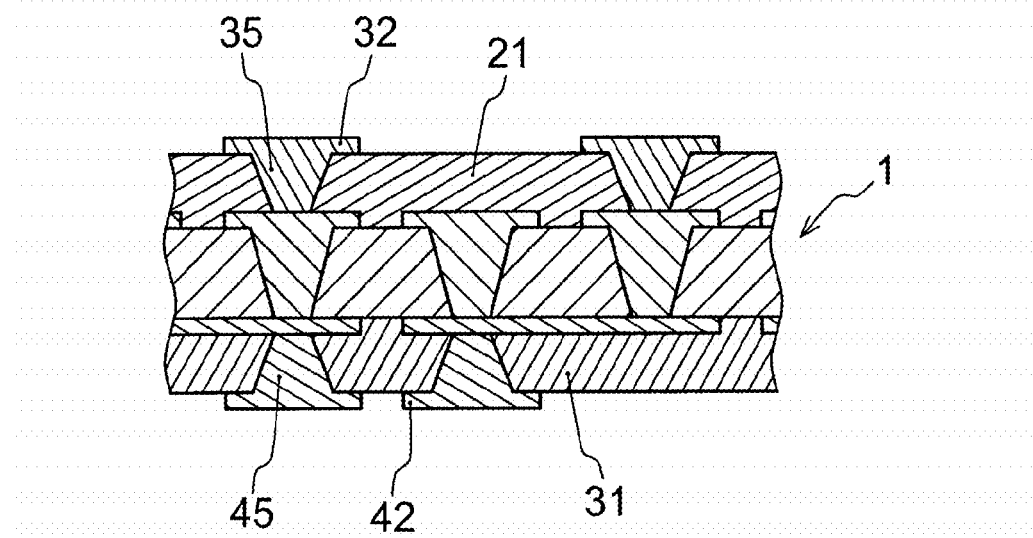
FIG. 3D illustrates a process for forming the build-up layer on each of both sides of the core substrate using the printed wiring board of FIG. 1 as the core substrate.

Thereafter, as illustrated in FIG. 3D, by patterning the third metal foil (32a), the metal coating (32b) and the third electroplating film (32c), the third conductor layer 32 is formed. Further, by patterning the fourth metal foil (42a), the metal coating (42b) and the fourth electroplating film (42c), the fourth conductor layer 42 is formed. The patterning is performed in the same way as the above-described process after the process of FIG. 2E. That is, by forming a resist mask on the third conductor layer 32 side and on the fourth conductor layer side and performing etching at the same time, patterning is performed at the same time.

When the third and fourth electroplating films (32c, 42c) are formed by pattern plating, patterning may be performed only for the third metal foil (32a) and the metal coating (32b) and for the fourth metal foil (42a) and the metal coating (42b). Therefore, without forming a resist mask, patterning may be performed by immersing the entire wiring board in an etching solution. This is because the metals foil and the metal coatings are thin and thus have little effect on other metal films.

Figure 3E:
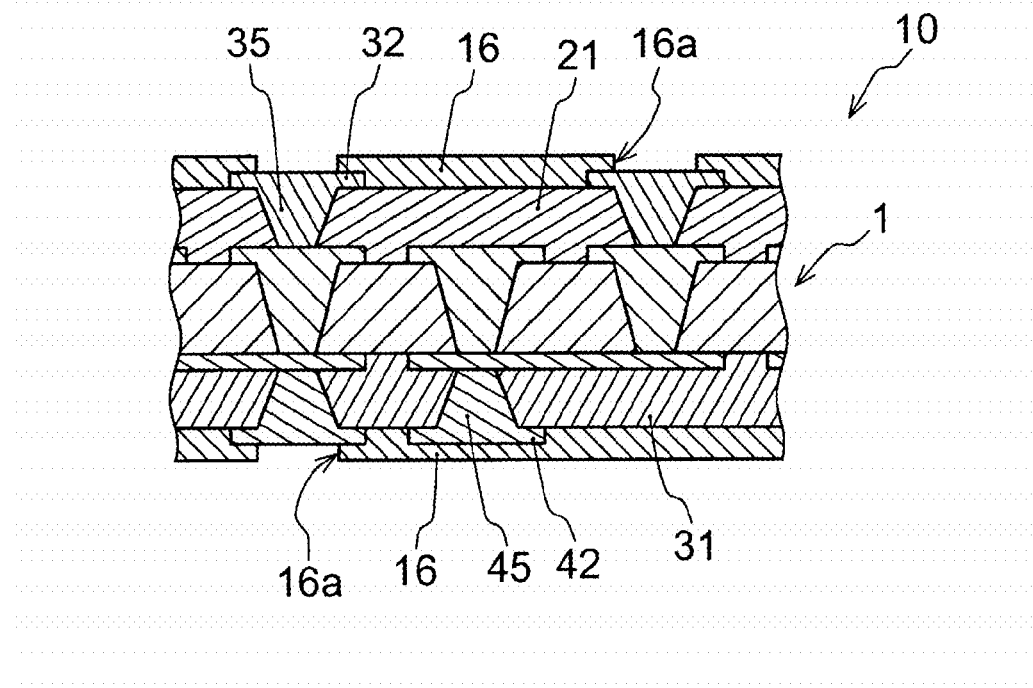
FIG. 3E illustrates a process for forming the build-up layer on each of both sides of the core substrate using the printed wiring board of FIG. 1 as the core substrate.

Next, as illustrated in FIG. 3E, a solder resist layer 16 is formed on both surfaces so as to protect exposed surfaces of the third conductor layer 32 and the fourth conductor layer 42. As a result, a printed wiring board 10 is obtained in which one build-up layer is formed on each of both sides of the printed wiring board 1 as a core substrate. An opening (16a) is formed in the solder resist layer 16 so as to expose a portion that connects to another electronic component or a motherboard or the like. When build-up layers and the like are further laminated, by not forming the solder resist layer 16 after the above-described process of FIG. 3D and further repeating the above-described processes of FIG. 3A-3D, a desired multilayer printed wiring board can be obtained.

Although not illustrated in the drawings, the exposed portions of the conductor layers that connect to an electronic component or the like are subjected to a surface treatment using coatings such as OSP, Ni/Au, Ni/Pd/Au, Sn, and the like.

In the above-described example, the printed wiring board 1 that includes the one-layer resin insulating layer 11 and the first and second conductor layers (12, 14) that are respectively formed on the two sides of the resin insulating layer 11 is illustrated as a core substrate on each side of which a build-up layer is formed. However, it is also possible that a printed wiring board in which these resin insulating layer and conductor layer are further laminated in multiples is used as a core substrate. A method for manufacturing this printed wiring board is described with reference to FIG. 4A-4C. Even when the resin insulating layer 11 is thin, a core substrate with high mechanical strength can be obtained.

Figure 4A:
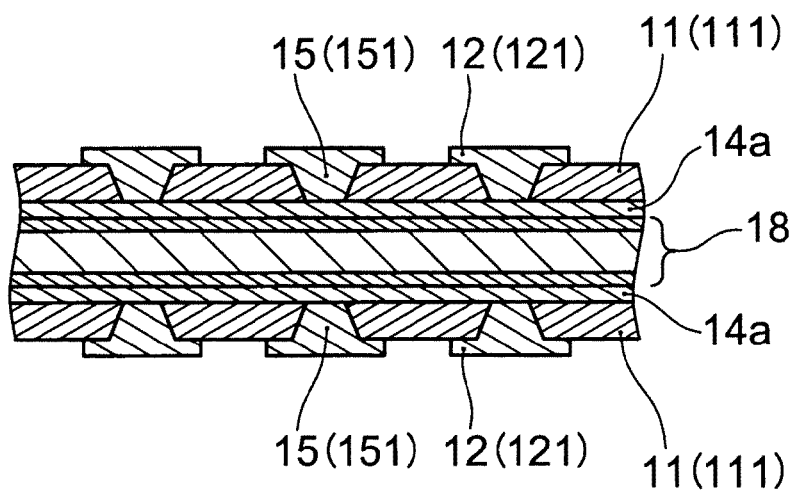
FIG. 4A is a process diagram illustrating a part of a process for manufacturing a printed wiring board according to another embodiment of the present invention.

Processing is the same as the above-described example up to the above-described process illustrated in FIG. 2D. Thereafter, as illustrated in FIG. 4A, the first conductor layer 12 is patterned to have a desired pattern. Other structures are the same as those in FIG. 2D and thus description thereof is omitted. However, a reference numeral 15 indicates the via conductor that connects the first conductor layer 12 and the second metal foil (14a). The patterning is performed in the same way as the above-described patterning after the process of FIG. 2E. As a result, on the second metal foil (14a) of the carrier 18 (on which the second metal foil (14a) is pasted) the resin insulating layer 11 (first resin insulating layer 111), the first conductor layer 12 (first core conductor layer 121) and the via conductor 15 (151) are formed. However, since the carrier 18 is not separated, the second metal foil (14a) is not yet exposed. Therefore, the second metal foil (14a) is not patterned. As described above, the first conductor layer 12 is formed by the first metal foil (12a), the metal coating (12b) that is formed by chemical plating or the like, and the electroplating film (12c). However, in FIG. 4A, the first conductor layer 12 is illustrated as one layer for simplicity.

Thereafter, processes same as the above-described processes illustrated in FIG. 2B-2D are repeated. As a result, on the first core conductor layer 121 (first conductor layer 12) and the first resin insulating layer 111 (resin insulating layer 11), a second resin insulating layer 112, a second core conductor layer 122, a via conductor 152, a third resin insulating layer 113, a third core conductor layer 123, and a via conductor 153 are formed.

Figure 4B:
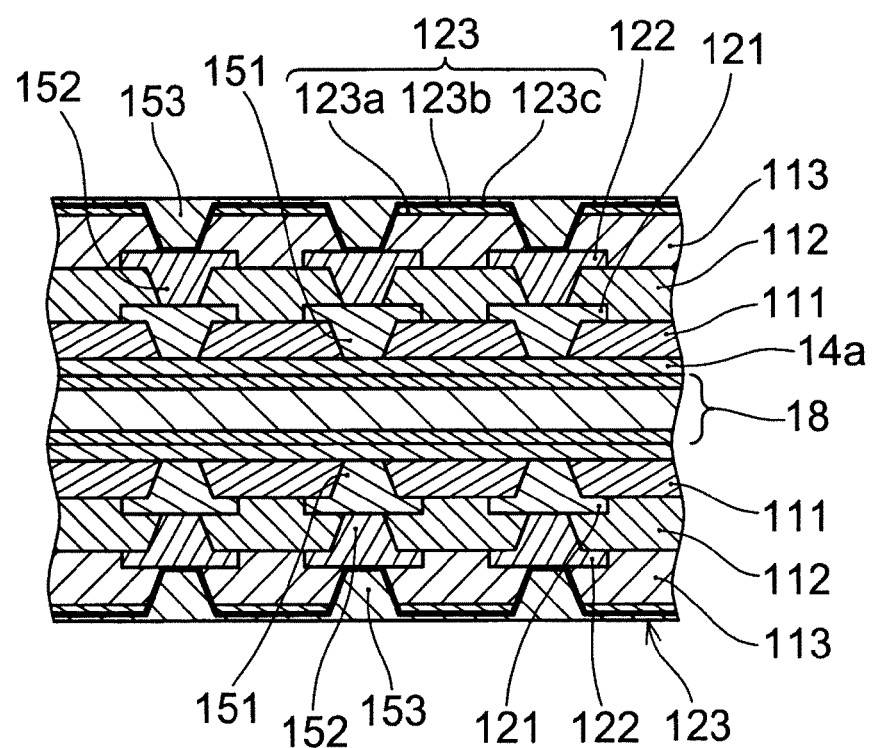
FIG. 4B is a process diagram illustrating a part of the process for manufacturing the printed wiring board according to the other embodiment of the present invention.

This state is illustrated in FIG. 4B. The third core conductor layer 123 is illustrated as being divided into a metal foil (123a), a metal coating (123b) and an electroplating film (123c). It is also possible that the number of resin insulating layers and the number of core conductor layers that are laminated on the carrier copper foil 18 are two or are four or more.

Figure 4C:
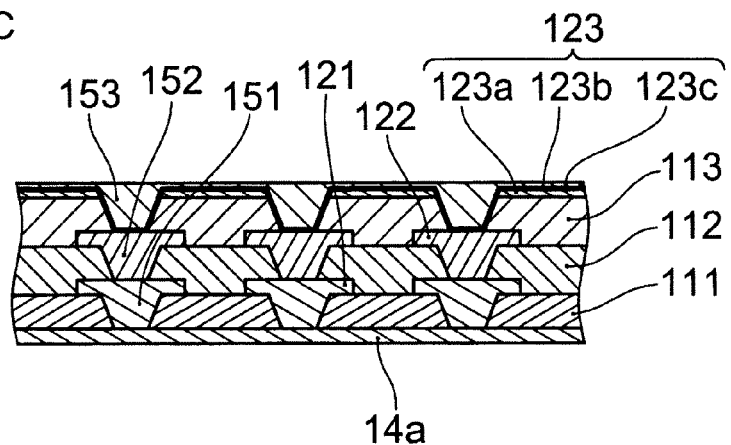
FIG. 4C is a process diagram illustrating a part of the process for manufacturing the printed wiring board according to the other embodiment of the present invention.

Thereafter, as illustrated in FIG. 4C, the carrier 18 is removed. The removal of the carrier 18 is performed in the same way as in the method described in the above-described process of FIG. 2E. Thereafter, similar to the above-described example, the second conductor layer 14 and the third core conductor layer 123 are simultaneously patterned. As a result, a printed wiring board in which three resin insulating layers are built up is formed as a core substrate. On both sides of this printed wiring board, as illustrated in FIG. 3A-3E, the build-up layers that include the interlayer resin insulating layers (21, 31) and the third and fourth conductor layers (32, 42) can be formed.

A printed wiring board 100 is illustrated in FIG. 7A. For example, by irradiating laser from an upper surface of a copper foil 120 on one side of a double-sided copper-clad insulating layer, an opening (110d) is formed that penetrates the resin insulating layer 110 and exposes a copper foil 140 on the other side. Thereafter, a via conductor 150 is formed by filling copper in the opening (110d) using an electroplating method, and a first conductor layer 120 and a second conductor layer 140 are formed by forming an electroplating film on each of the copper foils on the two sides.

Figure 7B:
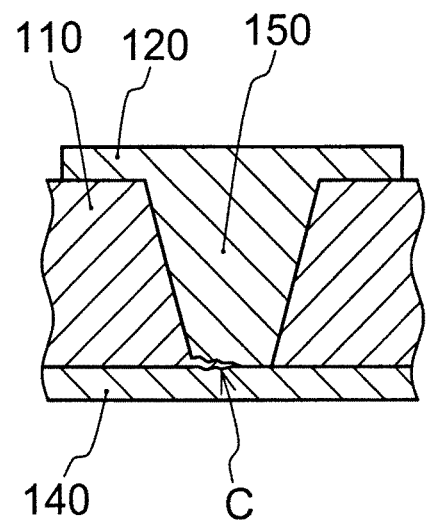
FIG. 7B describes a state of a crack between a via conductor and a second metal foil of FIG. 7A.

When a multilayer printed wiring board is formed using the above-described core substrate to form a build-up layer, as illustrated in FIG. 7B, a crack (C) may enter between the via conductor 150 and the copper foil of the second conductor layer 140 and electrical resistance increases.

A printed wiring board according to an embodiment of the present invention has a core substrate on which a build-up layer is formed, and in which a contact part between a via conductor and a metal foil connected to the via conductor is reliably connected and a crack is unlikely to occur, and another embodiment of the present invention is a method for manufacturing such a printed wiring board.

A method for manufacturing a printed wiring board according to an embodiment of the present invention includes: laminating and fixing a second metal foil, a resin insulating layer and a first metal foil on a carrier; forming an opening that uses the second metal foil as a bottom surface by performing laser irradiation from the first metal foil side; forming a via conductor in the opening by using a plating method and forming an electroplating film on the first metal foil; peeling off the carrier; forming a first conductor layer on a first surface of the resin insulating layer by patterning at least the first metal foil; and forming a second conductor layer on a second surface of the resin insulating layer by removing a portion of the second metal foil such that the second metal foil is patterned. At a stage before the process in which the opening is formed, the second metal foil is formed thicker than the first metal foil.

A printed wiring board according to an embodiment of the present invention includes: a resin insulating layer that has a first surface and a second surface; a first conductor layer that includes a first metal foil and an electroplating film that are formed on the first surface of the resin insulating layer; a second conductor layer that includes a second metal foil that is formed on the second surface of the resin insulating layer; and a via conductor that is formed in the resin insulating layer and connects the first conductor layer and the second conductor layer. The first conductor layer that includes the 記 first metal foil and the electroplating film and the second conductor layer that includes the second metal foil have substantially the same thickness, and the second metal foil is thicker than the first metal foil. Further, the via conductor is formed in an opening that penetrate the resin insulating layer and uses the second metal foil as a bottom surface.

Obviously, numerous modifications and variations of the present invention are possible in light of the above teachings. It is therefore to be understood that within the scope of the appended claims, the invention may be practiced otherwise than as specifically described herein.

What is claimed is:

1. The method for manufacturing a printed wiring board, comprising:
   forming on a carrier a laminate structure comprising a second metal foil, a resin insulating layer laminated on the second metal foil and a first metal foil laminated on the resin insulating layer;
   irradiating laser upon the first metal foil such that an opening is formed through the first metal foil and the resin insulating layer and exposes a surface of the second metal foil at a bottom of the opening;
   plating the first metal foil such that a via conductor is formed in the opening and a first conductor layer comprising the first metal foil and an electroplating film on the first metal foil is formed on a first surface of the resin insulating layer;
   removing the carrier from the laminate structure;
   patterning the first conductor layer formed on the resin insulating layer; and
   patterning the second metal foil such that a second conductor layer comprising the second metal foil is formed on a second surface of the resin insulating layer,
   wherein the second metal foil has a thickness which is greater than a thickness of the first metal foil.

2. The method for manufacturing a printed wiring board according to claim 1, wherein the plating of the first metal foil comprises plating the first metal foil such that the first conductor layer comprising the first metal foil and the electroplating film is formed to have a thickness which is substantially equal to the thickness of the second conductor layer comprising the second metal foil.

3. The method for manufacturing a printed wiring board according to claim 2, wherein the irradiating laser comprises irradiating the laser directly upon the first metal foil.

4. The method for manufacturing a printed wiring board according to claim 2, further comprising:
   forming a metal coating on an entire surface of the first metal foil prior to the plating,
   wherein the plating of the first metal foil comprises forming the first conductor layer comprising the first metal foil, the metal coating on the first metal foil and the electroplating film on the metal coating, and the patterning of the first conductor layer comprises removing part of the metal coating and the first metal foil.

5. The method for manufacturing a printed wiring board according to claim 4, wherein the patterning of the first conductor layer and the patterning of the second metal foil are conducted in a same process.

6. The method for manufacturing a printed wiring board according to claim 2, further comprising:
   forming on an opposite side of the carrier with respect to the laminate structure a second laminate structure comprising a second metal foil, a resin insulating layer laminated on the second metal foil and a first metal foil laminated on the resin insulating layer.

7. The method for manufacturing a printed wiring board according to claim 2, further comprising:

forming a buildup layer on a surface of the laminate structure such that the laminate structure forms a core substrate.

8. The method for manufacturing a printed wiring board according to claim 2, further comprising:
  forming a buildup layer on a first surface of the laminate structure such that the laminate structure forms a core substrate; and
  forming a second buildup layer on a second surface of the laminate structure on an opposite side with respect to the first surface of the laminate structure such that the laminate structure forms a core substrate.

9. The method for manufacturing a printed wiring board according to claim 2, wherein the plating comprises forming a resist layer on the first metal foil and pattern-plating on the first metal foil, and the patterning of the first conductor layer comprises removing part of the first metal foil.

10. The method for manufacturing a printed wiring board according to claim 2, wherein the plating comprises pattern-plating on the first metal foil, and the patterning of the first conductor layer comprises removing part of the first metal foil.

11. The method for manufacturing a printed wiring board according to claim 1, wherein the irradiating laser comprises irradiating the laser directly upon the first metal foil.

12. The method for manufacturing a printed wiring board according to claim 1, further comprising:
  forming a metal coating on an entire surface of the first metal foil prior to the plating,
  wherein the plating of the first metal foil comprises forming the first conductor layer comprising the first metal foil, the metal coating on the first metal foil and the electroplating film on the metal coating, and the patterning of the first conductor layer comprises removing part of the metal coating and the first metal foil.

13. The method for manufacturing a printed wiring board according to claim 12, wherein the patterning of the first conductor layer and the patterning of the second metal foil are conducted in a same process.

14. The method for manufacturing a printed wiring board according to claim 1, further comprising:
  forming on an opposite side of the carrier with respect to the laminate structure a second laminate structure comprising a second metal foil, a resin insulating layer laminated on the second metal foil and a first metal foil laminated on the resin insulating layer.

15. The method for manufacturing a printed wiring board according to claim 1, further comprising:
  forming a buildup layer on a surface of the laminate structure such that the laminate structure forms a core substrate.

16. The method for manufacturing a printed wiring board according to claim 1, further comprising:
  forming a buildup layer on a first surface of the laminate structure such that the laminate structure forms a core substrate; and
  forming a second buildup layer on a second surface of the laminate structure on an opposite side with respect to the first surface of the laminate structure such that the laminate structure forms a core substrate.

17. The method for manufacturing a printed wiring board according to claim 1, wherein the plating comprises forming a resist layer on the first metal foil and pattern-plating on the first metal foil, and the patterning of the first conductor layer comprises removing part of the first metal foil.

18. The method for manufacturing a printed wiring board according to claim 1, wherein the patterning of the first conductor layer and the patterning of the second metal foil are conducted in a same process.

\* \* \* \* \*